(12) United States Patent
Chai (10) Patent No.: US 11,879,931 B2
(45) Date of Patent: Jan. 23, 2024

(54) CIRCUIT TESTING AND DIAGNOSIS

(71) Applicant: Hamilton Sundstrand Corporation, Charlotte, NC (US)

(72) Inventor: Huazhen Chai, Caledonia, IL (US)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 108 days.

(21) Appl. No.: 17/411,258

(22) Filed: Aug. 25, 2021

(65) Prior Publication Data

US 2023/0064503 A1 Mar. 2, 2023

(51) Int. Cl.
*G01R 31/28* (2006.01)
*H02H 1/00* (2006.01)
*H02H 9/04* (2006.01)

(52) U.S. Cl.
CPC ......... *G01R 31/2827* (2013.01); *H02H 1/003* (2013.01); *H02H 9/045* (2013.01)

(58) Field of Classification Search
CPC ............... H02H 1/003; H01H 3/20–22; G01R 29/0842; G01R 31/2827
USPC .................................................... 324/537, 72
See application file for complete search history.

(56) References Cited

U.S. PATENT DOCUMENTS

| | | | | |
|---|---|---|---|---|
| 7,825,750 B2* | 11/2010 | Lee | ...................... | H03H 7/0107 333/167 |
| 8,994,391 B2* | 3/2015 | Heiland, Jr. | ......... | G01R 31/001 324/756.07 |
| 9,128,119 B2* | 9/2015 | Said | ..................... | G01R 1/0416 |
| 9,459,300 B2* | 10/2016 | Heiland, Jr. | ......... | G01R 31/001 |
| 11,088,529 B2* | 8/2021 | Meline | ..................... | H02H 1/04 |

(Continued)

FOREIGN PATENT DOCUMENTS

| CA | 2844412 A1 * | 5/2013 | ............. B64D 45/00 |
|---|---|---|---|
| CN | 106786460 A * | 5/2017 | |

(Continued)

OTHER PUBLICATIONS

Com-Power Corporation. Line Impedance Stabilization Network: LI-400. Rev. D04.14. www.com-power.com. Aug. 2020. (Year: 2020).*

(Continued)

*Primary Examiner* — Patrick Assouad
*Assistant Examiner* — Sean Curtis
(74) *Attorney, Agent, or Firm* — CANTOR COLBURN LLP (57) ABSTRACT

Systems and methods for testing a lightning protection circuit are provided. Aspects include providing an alternating current (AC) test signal source coupled to a circuit under test, the circuit under test comprising a lightning protection circuit having a threshold voltage, a first filter, and a second filter, providing a direct current (DC) voltage supply in series with a filtering device, the filtering device coupled to the AC test signal source, providing a first capacitor coupled between the AC test signal source and the circuit under test, operating the DC voltage supply and the AC test signal source to provide a first test signal to the circuit under test, wherein the first test signal comprise a first voltage that exceeds the threshold voltage, measuring a first impedance of the circuit under test responsive to providing the first test signal, wherein the first impedance corresponds to the first filter.

10 Claims, 6 Drawing Sheets

(56) References Cited

U.S. PATENT DOCUMENTS

| | | | | |
|---|---|---|---|---|
| 2003/0156367 | A1* | 8/2003 | Macbeth | H02H 1/0015 361/38 |
| 2007/0296277 | A1* | 12/2007 | Lee | H03H 7/0107 307/105 |
| 2011/0242721 | A1* | 10/2011 | Chen | H05K 1/0254 361/131 |
| 2013/0285683 | A1* | 10/2013 | Heiland, Jr. | G01R 31/66 324/750.3 |
| 2014/0292365 | A1* | 10/2014 | Said | G01R 31/1227 324/756.05 |
| 2014/0306714 | A1* | 10/2014 | Hess | H02H 9/041 361/111 |
| 2015/0160278 | A1* | 6/2015 | Heiland, Jr. | G01R 31/66 324/627 |
| 2016/0069942 | A1* | 3/2016 | Heiland, Jr. | G01R 31/001 324/627 |
| 2020/0381912 | A1* | 12/2020 | Meline | G01D 5/2291 |
| 2020/0382110 | A1* | 12/2020 | Meline | G01R 1/30 |
| 2023/0064503 | A1* | 3/2023 | Chai | H02H 1/003 |

FOREIGN PATENT DOCUMENTS

| | | | | |
|---|---|---|---|---|
| CN | 110146794 | A | | 8/2019 |
| CN | 112415352 | A | | 2/2021 |
| CN | 113125916 | A | * | 7/2021 |
| CN | 114204536 | A | * | 3/2022 |
| CN | 115219807 | A | * | 10/2022 |
| DE | 2125810 | A1 | | 6/1972 |
| EP | 2784525 | A1 | * | 10/2014 ........... G01R 1/0416 |
| EP | 4145145 | A1 | * | 3/2023 ......... G01R 31/2827 |
| GB | 2038490 | A | * | 7/1980 ............. G01R 27/14 |
| GB | 2038490 | A | | 7/1980 |
| JP | H0554744 | A | | 3/1993 |
| JP | H05547144 | A | | 3/1993 |
| WO | WO-2019086625 | A1 | * | 5/2019 ............. G01D 21/00 |

OTHER PUBLICATIONS

Ramdin, Navaal. Developing Scheduled Maintenance Requirements for HIRF/Lightning Protection on the 777 Airplane. SAE Transactions, vol. 108, Section 1: Journal of Aerospace (1999), pp. 191-197 (Year: 1999).*

European Search Report for Application No. 22192233.9, dated Feb. 3, 2023, 5 pages.

Machine Translation for CN112415352 (A), Published: Feb. 26, 2021.

Machine Translation for DE2125810 (A1), Published: Jun. 15, 1972, 6 pages.

Machine Translation of CN110146794 (A), Published: Aug. 20, 2019, 11 pages.

* cited by examiner

CIRCUIT TESTING AND DIAGNOSIS

BACKGROUND

The present invention generally relates to circuit testing and, more specifically to testing and diagnosis of lightning protection circuits through an input port.

Electrical systems, such as aircraft electrical systems, commonly include power generation systems, which generate power from turbine rotation, and wiring, which distributes the generated power to devices such as motors and onboard electronics. When an aircraft is struck by lightning at least a portion of the energy from the lightning strike can be transmitted through the electrical system wiring into electrical devices carried by the aircraft, e.g., motors and/or onboard electronics. The transmitted energy can potentially reducing the functionality of certain types of electronic devices, for example by tripping current flow control devices like breakers, or damaging electronic devices by applying excessive voltage stress to electronic devices. To the loss of functionality and/or damage to electronic devices from transients, some aircraft electrical systems employ lightening protection devices. The lightning protection devices typically prevent transient energy from reaching the onboard electronics, such as be dissipating the energy, thereby protecting onboard electronics from the lightning strike.

These lightning protection devices are typically housed in line replaceable units (LRU) which are modular units for being replaced quickly on the line. However, testing these LRUs and the circuitry within the LRUs can present a challenge due to the fact that opening up an LRU typically requires more testing and certification before the LRU can be installed back into an aircraft. The LRUs can be particularly difficult to test when housing a lightning protection device due to the characteristics of these lightning protection devices that either clip or cut off testing voltage levels that exceed a threshold voltage (i.e., when lighting strikes the aircraft).

BRIEF DESCRIPTION

Embodiments of the present invention are directed to a system. A non-limiting example of the system includes an alternating current (AC) test signal source coupled to a circuit under test, wherein the circuit under test comprising a lightning protection circuit having a threshold voltage, a first filter, and a second filter, a direct current (DC) voltage supply in series with a filtering device, the filtering device coupled to the AC test signal source, a first capacitor coupled between the AC test signal source and the circuit under test, a controller configured to operate the DC voltage supply and the AC test signal source to provide a first test signal to the circuit under test, wherein the first test signal comprise a first voltage that exceeds the threshold voltage, measure a first impedance of the circuit under test responsive to providing the first test signal to the circuit under test, wherein the first impedance corresponds to the first filter.

In addition to one or more of the features described above, or as an alternative, further embodiments of the system may include that the controller is further configured to operate the DC voltage supply and the AC test signal source to provide a second test signal to the circuit under test, wherein the second test signal comprises a second voltage that is below the threshold voltage, measure a second impedance of the circuit under test responsive to providing the second test signal to the circuit under test, wherein the second impedance corresponds to the first filter, the lightning protection circuit, and the second filter, and determining at least one fault for the circuit under test based on the first impedance and the second impedance.

In addition to one or more of the features described above, or as an alternative, further embodiments of the system may include that the lightning protection circuit is in series between the first filter and the second filter.

In addition to one or more of the features described above, or as an alternative, further embodiments of the system may include that the first filter is closer to an external input of the circuit under test than the second filter.

In addition to one or more of the features described above, or as an alternative, further embodiments of the system may include that the lightning protection circuit is configured to block the first test signal based on the first voltage exceeding the threshold voltage.

In addition to one or more of the features described above, or as an alternative, further embodiments of the system may include that the lightning protection circuit is configured to clip the first test signal based on the first voltage exceeding the threshold voltage.

In addition to one or more of the features described above, or as an alternative, further embodiments of the system may include that the filter device comprises a line impedance stabilization network (LISN).

In addition to one or more of the features described above, or as an alternative, further embodiments of the system may include that the first filter comprises a high-intensity radiated field (HIRF) filter.

In addition to one or more of the features described above, or as an alternative, further embodiments of the system may include that the second filter comprises an electromagnetic interference (EMI) filter.

In addition to one or more of the features described above, or as an alternative, further embodiments of the system may include that the first capacitor has a capacitance of at least 100 micro-Farads.

Embodiments of the present invention are directed to a method. A non-limiting example of the method includes providing an alternating current (AC) test signal source coupled to a circuit under test, wherein the circuit under test comprising a lightning protection circuit having a threshold voltage, a first filter, and a second filter, providing a direct current (DC) voltage supply in series with a filtering device, the filtering device coupled to the AC test signal source, providing a first capacitor coupled between the AC test signal source and the circuit under test, operating, by a controller, the DC voltage supply and the AC test signal source to provide a first test signal to the circuit under test, wherein the first test signal comprise a first voltage that exceeds the threshold voltage, measuring, by the controller, a first impedance of the circuit under test responsive to providing the first test signal to the circuit under test, wherein the first impedance corresponds to the first filter.

In addition to one or more of the features described above, or as an alternative, further embodiments of the method may include operating, by the controller, the DC voltage supply and the AC test signal source to provide a second test signal to the circuit under test, wherein the second test signal comprises a second voltage that is below the threshold voltage, measuring, by the controller, a second impedance of the circuit under test responsive to providing the second test signal to the circuit under test, wherein the second impedance corresponds to the first filter, the lightning protection circuit, and the second filter, and determining, by the controller, at least one fault for the circuit under test based on the first impedance and the second impedance.

In addition to one or more of the features described above, or as an alternative, further embodiments of the method may include that the lightning protection circuit is in series between the first filter and the second filter.

In addition to one or more of the features described above, or as an alternative, further embodiments of the method may include that the first filter is closer to an external input of the circuit under test than the second filter.

In addition to one or more of the features described above, or as an alternative, further embodiments of the method may include that the lightning protection circuit is configured to block the first test signal based on the first voltage exceeding the threshold voltage.

In addition to one or more of the features described above, or as an alternative, further embodiments of the method may include that the lightning protection circuit is configured to clip the first test signal based on the first voltage exceeding the threshold voltage.

In addition to one or more of the features described above, or as an alternative, further embodiments of the method may include that the filter device comprises a line impedance stabilization network (LISN).

In addition to one or more of the features described above, or as an alternative, further embodiments of the method may include that the first filter comprises a high-intensity radiated field (HIRF) filter.

In addition to one or more of the features described above, or as an alternative, further embodiments of the method may include that the second filter comprises an electromagnetic interference (EMI) filter.

In addition to one or more of the features described above, or as an alternative, further embodiments of the method may include that the first capacitor has a capacitance of at least 100 micro-Farads.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

DETAILED DESCRIPTION

For the sake of brevity, conventional techniques related to making and using aspects of the invention may or may not be described in detail herein. In particular, various aspects of aircraft electric power systems to implement the various technical features described herein are well known. Accordingly, in the interest of brevity, many conventional implementation details are only mentioned briefly herein or are omitted entirely without providing the well-known system and/or process details.

Figure 1:
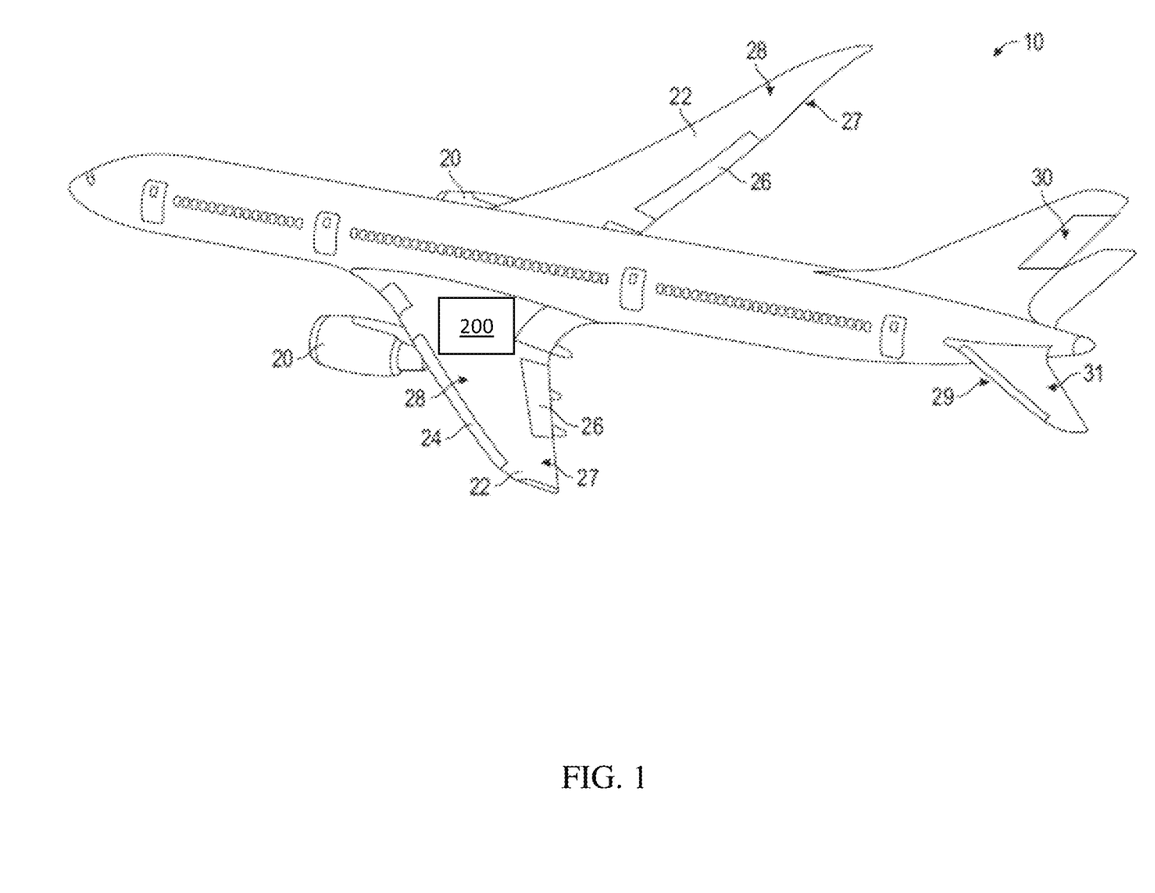
FIG. 1 is a perspective view of an aircraft that may incorporate embodiments of the present disclosure.

FIG. 1 illustrates an example of a commercial aircraft 10 having aircraft engines 20 that may embody aspects of the teachings of this disclosure. The aircraft 10 includes two wings 22 that each include one or more slats 24 and one or more flaps 26. The aircraft further includes ailerons 27, spoilers 28, horizontal stabilizer trim tabs 29, rudder 30 and horizontal stabilizer 31. The term "control surface" used herein includes but is not limited to either a slat or a flap or any of the above described. It will be understood that the slats 24 and/or the flaps 26 can include one or more slat/flap panels that move together. The aircraft 10 also includes a line replaceable unit 200 (described in greater detail in FIG. 2) which includes a lightning protection circuit and one or more filters.

Turning now to an overview of technologies that are more specifically relevant to aspects of the disclosure, aircraft are protected by devices mounted to the aircraft structure and by the design of internal systems. Lightning usually enters and exits an aircraft through the outer surface of its airframe or through static dischargers. A lightning protection system provides safe conductive paths between the entry and exit points to prevent damage to electronic equipment and to protect flammable fuel or cargo from sparks. These paths are constructed of conductive materials. Electrical insulators are only effective in combination with a conductive path because blocked lightning can easily exceed the breakdown voltage of insulators. Composite materials are constructed with layers of wire mesh to make them sufficiently conductive and structural joints are protected by making an electrical connection across the joint. Shielded cable and conductive enclosures provide the majority of protection to electronic systems.

The lightning-conductive path and conductive shielding carry the majority of current. The remainder is bypassed around sensitive electronics using transient voltage suppressors, and blocked using electronic filters once the let-through voltage is low enough. Filters, like insulators, are only effective when lightning and surge currents are able to flow through an alternate path. Some example filters include a high-intensity radiated field (HIRF) filter and an electromagnetic interference (EMI) filter. These filters typically include passive components such as inductors and capacitors and are configured as a one-stage or a multi-stage low pass filter. A very high proportion of component failures in HIRF and EMI filters are latent failure modes that are not detected in functional tests. For a 28V control power with a lighting protection circuit, the detection of latent failures becomes even more problematic due to the interaction before and after the lighting protection switch. In essence, the testing of lightning protection circuits is difficult because the protection switch will filter out test signals sent to test filter components past the switch. One way to address this issue is to open up the line-replaceable unit (LRU) that houses the lighting protection circuit and test the individual components. However, this will cost time and money due to the difficulty in accessing these components in an aircraft. Thus, aspects of the present disclose provide for testing scheme/methodologies for determining latent failures in lighting protection circuits without the need to open up the housing of the protection circuits. The testing scheme decouples the interaction between circuits before and after the lighting switch. The test is conducted through the LRU external input 28V power connector. An LRU is a modular component of an aircraft that is designed to be replaced quickly at an operating location (1st line). An LRU is usually a sealed unit housing auxiliary equipment such as a lightning protection circuit. The testing scheme is designed to ensure that the LRU enclosure/seal is not compromised during testing.

Typical testing schemes rely on measuring an input line to chassis capacitance at low frequency to check the collective total paralleled capacitance of all components connected to a line. However, this only detects larger capacity capacitor failures while the majority of other component failures are not detected. Also, because of the lower test signal level and frequency, the protection circuit after the lightning switch is not effectively tested, typically.

In one or more embodiments, the testing scheme utilizes a DC bias that is added to a test signal to drive the lightning switch to a preferable known status to facilitate the detection of the HIRF and EMI filter component failures. This DC bias is injected through an injection capacitor and a line impedance stabilization network (LISN). The impedance measurements are carried out at selected frequencies and a number of DC bias levels to make the measurement most sensitive to the component to be tested during the testing.

Figure 2:
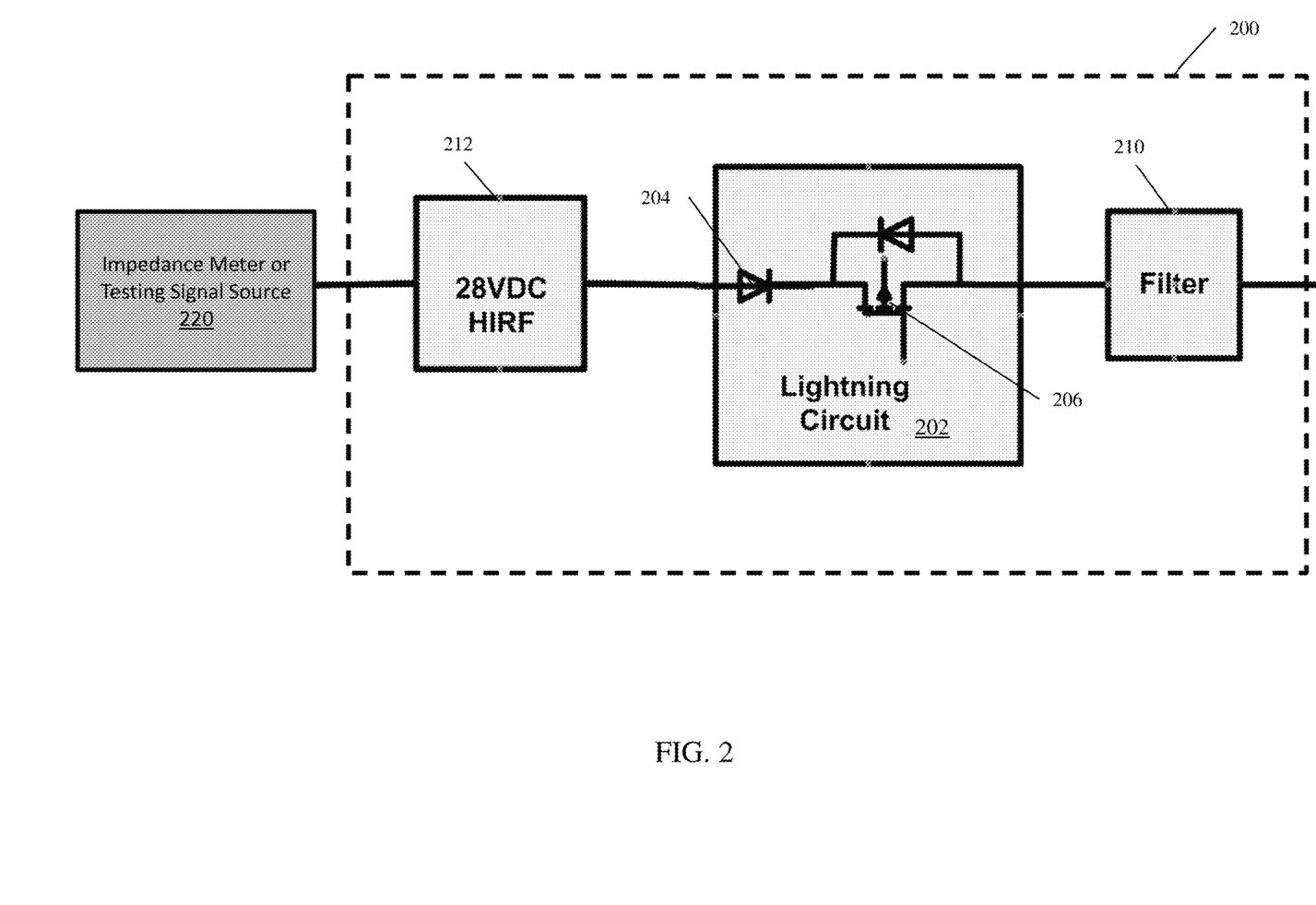
FIG. 2 depicts a block diagram of an exemplary LRU including an HIRF filter, EMI filter, and lighting protection circuit according to one or more embodiments.

FIG. 2 depicts a block diagram of an exemplary LRU including an HIRF filter, EMI filter, and lighting protection circuit according to one or more embodiments. As illustrated, the LRU 200 includes the lightning circuit 202. The lightning circuit includes a diode 204 and a semiconductor switch 206. The LRU 200 also includes other filters such as the HIRF filter 212 and an EMI filter 210. When an input voltage (i.e., test signal) exceeds a pre-set level, the output voltage is either cut off or clipped to a pre-set max level. Typical testing schemes utilize an impedance meter and/or test signal source 220 applied to the input connector of the 28V control power. Depending on the frequency and the test signal voltage levels used, the behavior of the lightning circuit is not well defined. The parasitic parameters and the threshold voltages of the diode 204 and switch 206 would affect the measurement. This causes the effectiveness of the testing to be very limited leaving a high number of latent failure undetected.

Figure 3A:
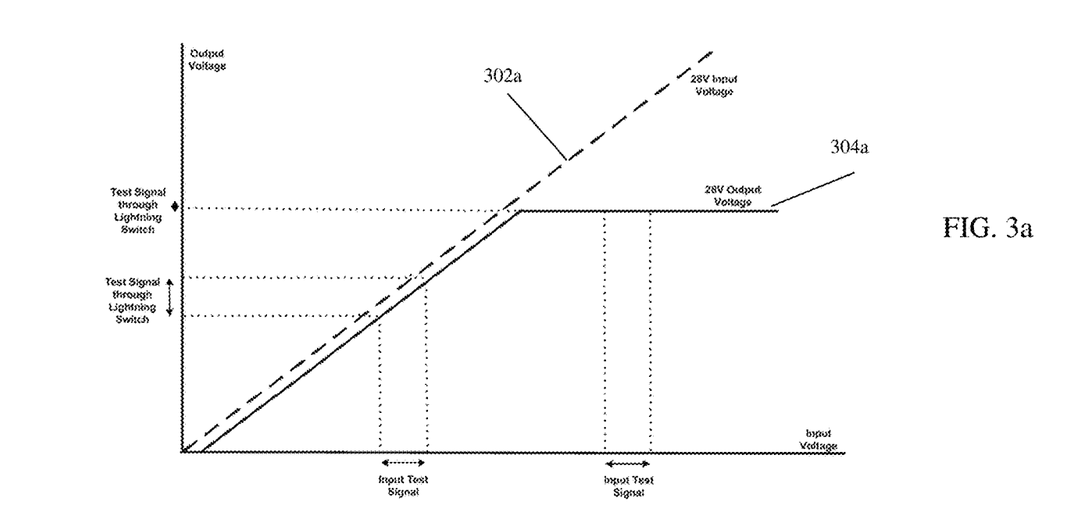
FIGS. 3a and 3b depict graphs illustrating an input voltage and output voltage based on the configuration of a lightning circuit according to one or more embodiments.
Figure 3B:
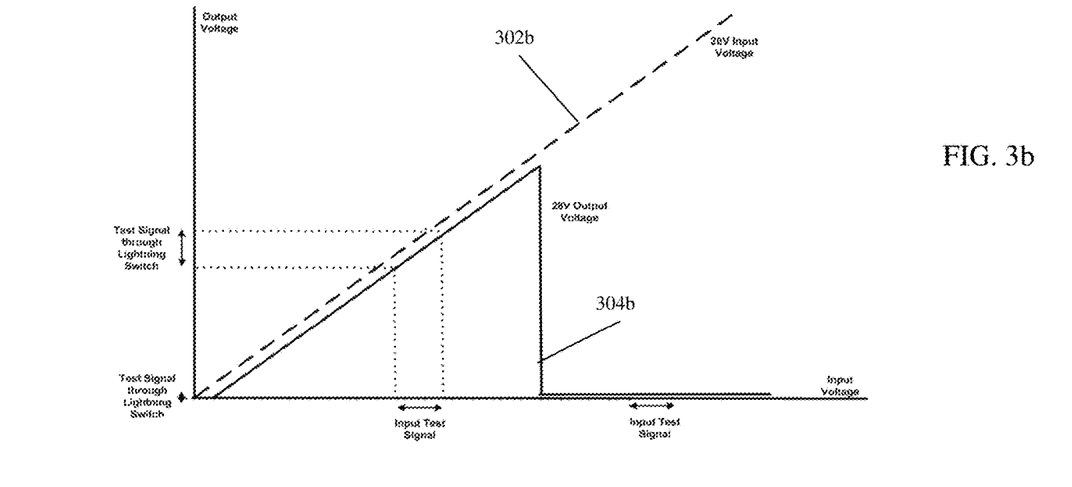

FIGS. 3a and 3b depict graphs illustrating an input voltage and output voltage based on the configuration of a lightning circuit according to one or more embodiments. FIG. 3a provides the exemplary graph for a lightning circuit that clips the output voltage at a preset level. The dashed line 302a depicts the input voltage and the solid line 304a depicts the output voltage. The input voltage is supplied from a test signal source 220 (from FIG. 2) and the output voltage is measured at an output of the LRU 200 (from FIG. 2). Here the output voltage 304a clips (i.e., flattens out) when the input voltage hits a threshold voltage. FIG. 3b provides an exemplary graph for a lighting circuit that cuts off the output voltage at a preset level. The dashed line 302b depicts the input voltage and the solid line 304b depicts the output voltage. The input voltage is supplied from a test signal source 220 (from FIG. 2) and the output voltage is measured at an output of the LRU 200 (from FIG. 2). Here, the output voltage 304b cuts off and is driven to preset level when a threshold input voltage is hit. The exemplary graphs illustrate principles related to the testing method described herein. When an incorporated DC bias is below the threshold for the lighting circuit, given an excitation dx, the response dy is equal to dx (i.e., dy/dx=1), where dx is the test signal and dy is the response. When the DC bias is above the threshold, the response dy is 0 given excitation dx (i.e., dy/dx=0). When dy/dx=1, the circuit after the lightning switch is "visible" or detectable to external test signals. When dy/dx=0, the circuit after the lightning switch becomes "invisible" or non-detectable to external test signals.

In one or more embodiments, for testing the LRU 200 (from FIG. 2) the two filters are difficult to test due to the lightning protection circuit either cutting off or clipping the input voltage signal to the LRU as described in FIGS. 3a and 3b. To address this, one or more embodiments supply a DC bias voltage that is added to a small test signal supplied to the LRU. The LRU may be referred to as the Unit Under Test (UUT) or Circuit Under Test hereafter. When a DC bias voltage is added to a small test signal and the bias is below a preset threshold level of a lightning circuit, the lightning circuit is effectively "ON" for the small test signal. During testing, the impedance measured and its response when the lightning circuit is "ON" (i.e., DC bias plus small testing signal is below the threshold) is the combination of all the circuits in the circuit under test (i.e., HIRF filter, EMI filter, and lightning protection circuit). When the DC bias voltage along with the small test signal is greater than the lightning protection circuit threshold voltage, the lightning circuit is effectively "OFF" for this small test signal. The impedance measured would be for the circuits that are before the lightning protection circuit because the test signal would not pass the output side of the lightning protection circuit.

Figure 4:
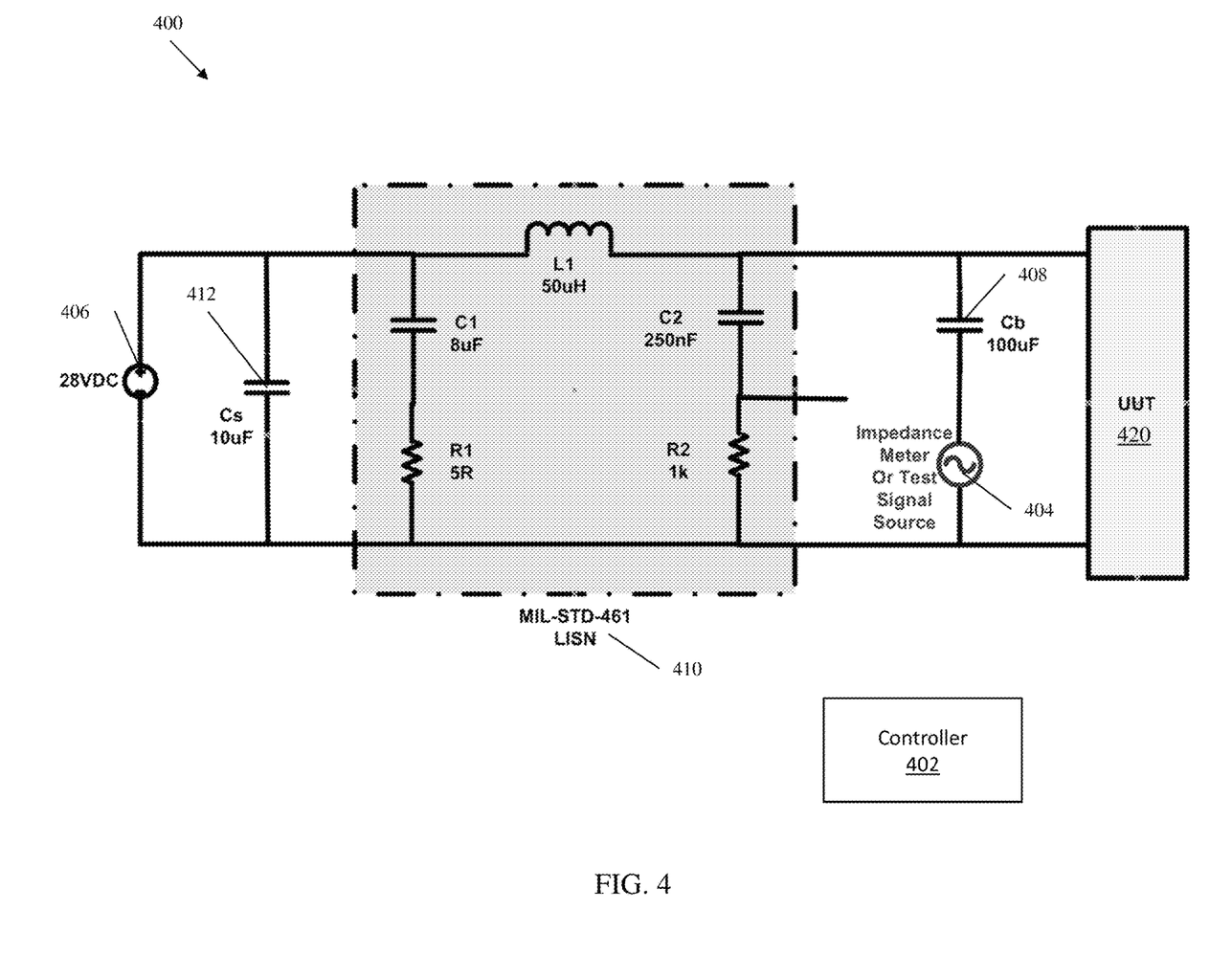
FIG. 4 depicts a diagram of a testing system for a lightning protection circuit according to one or more embodiments.

FIG. 4 depicts a diagram of a testing system for a lightning protection circuit according to one or more embodiments. The testing system 400 includes a test signal source 404 or impedance meter. In one or more embodiments, the test signal source can be an AC voltage source that injects the test signal and the impedance meter can be an AC current meter for the response. The injected voltage is divided by the measured current to get the impedance value. In some embodiments, an impedance meter can replace the voltage source and current meter. The impedance meter works by injecting either a voltage (or current) and measuring current (or voltage) then dividing the two numbers to display an impedance reading all carried out within the same instrument. This testing system 400 can be attached to an input of a unit under test (UUT) 420 (sometimes referred to as a circuit under test). In one or more embodiments, the UUT is the LRU 200 (from FIG. 2). The system 400 includes a DC bias voltage source 406 that is configured to supply/provide a DC bias voltage for the system 400. The test signal source 404 is configured to supply a small testing signal that is an alternating current (AC) test signal to the UUT 420. A first capacitor Cb 408 is included to couple the test signal source 404 to the test system 400 and to keep the DC bias from the test signal source 404. In one or more embodiments, the capacitance for this first capacitor is at least 100 µF. The system 400 also includes a line impedance stabilizing network (LISN) 410 that is utilized to minimize the amount of signal current to the DC bias source 406. A LISN is a low-pass filter typically placed between an AC or DC power source and the EUT (equipment under test) to create a known impedance and to provide a radio frequency (RF) noise measurement port. It also isolates any unwanted RF signals from the power source. The system 400, optionally, includes a second capacitor Cs 412 to further reduce the effect of the DC bias source 406 characteristic on the test results.

The system 400 also includes a controller 402 that is configured to operate any and all of the components in the system 400. In one or more embodiments, the controller 402 or any of the hardware referenced in the system 400 can be implemented by executable instructions and/or circuitry such as a processing circuit and memory. The processing circuit can be embodied in any type of central processing unit (CPU), including a microprocessor, a digital signal processor (DSP), a microcontroller, an application specific integrated circuit (ASIC), a field programmable gate array (FPGA), or the like. Also, in embodiments, the memory may include random access memory (RAM), read only memory (ROM), or other electronic, optical, magnetic, or any other computer readable medium onto which is stored data and algorithms as executable instructions in a non-transitory form.

In one or more embodiments, the controller 402 is configured to operate the test signal source 404 to supply an AC testing signal for the UUT 420. The controller 402 is further configured to operate/control the DC bias source 406 to provide a DC bias voltage for the UUT 420. The controller 402 can receive impedance measurements from the test signal source 404 for processing to determine the impedance for the UUT 420. As mentioned above, the DC bias and small testing signal are supplied to the UUT 420 to test the components that include an HIRF filter, a lightning protection circuit, and an EMI filter. In one or more embodiments, the HIRF filter is to the left of the lightning protection circuit, so any combination of test signal and DC bias voltage that has a voltage above the threshold voltage for the lighting protection circuit will shut off the lightning protection circuit and the impedance measured will be from just the HIRF filter in the UUT 420. When the DC bias and small testing signal are below the threshold for the lightning protection circuit, the impedance measurement is taken for the entire UUT 420. The controller 402 can utilize these impedance measurements to determine if any faults exist in the UUT 420 and further determine what type of fault exists. The determination of the existence of the fault can be based on a comparison of plotted impedance values tested at different frequencies to plotted impedance values for known components operating normally. The different frequencies for testing can include 3.5 kHz, 100 kHz, and 250 kHz which produce impedance values that can be plotted and compared to the plotted values of normal operating components. Any deviations observed between the plots can indicate a defective filter component either before or after the lightning switch depending on the DC bias.

Figure 5:
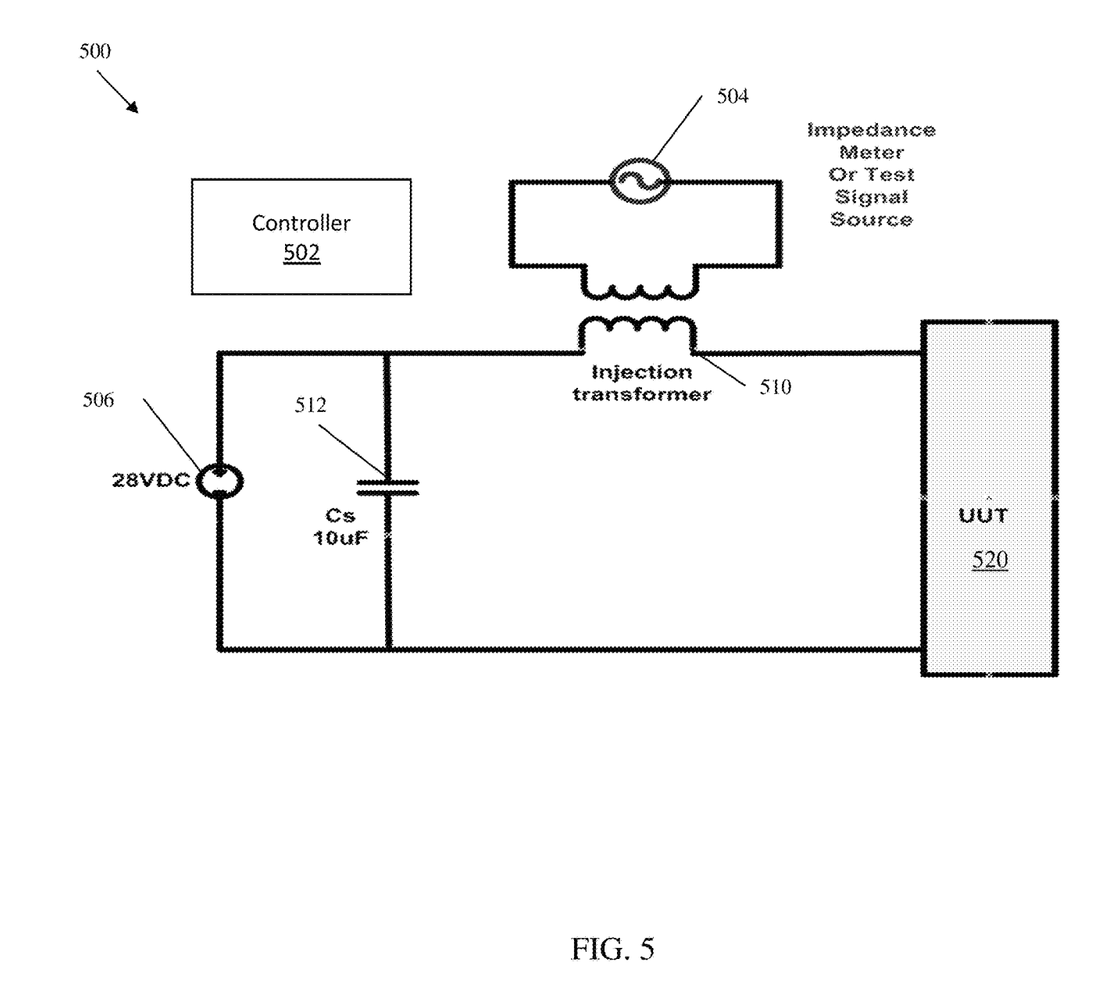
FIG. 5 depicts a diagram of a testing system for a lightning protection circuit according to one or more embodiments.

FIG. 5 depicts a diagram of a testing system for a lightning protection circuit according to one or more embodiments. The testing system 500 includes a test signal source 504 or impedance meter. The test signal source 504 is coupled to an injection transformer 510. The testing system 500 is attached to an input of a unit under test (UUT) 520 and configured to supply testing AC signals along with a DC bias voltage. In one or more embodiments, the UUT 520 includes a lightning protection circuit along with a HIRF filter and an EMI filter. The system 500 includes a DC bias voltage source 506 that is configured to supply/provide a DC bias voltage for the testing system 500. The system 500 also includes a first capacitor Cs 512 and a controller 502. In one or more embodiments, that controller 502 is configured to operate any and all of the components in the system 500. The controller 502 or any of the hardware referenced in the system 500 can be implemented by executable instructions and/or circuitry such as a processing circuit and memory. The processing circuit can be embodied in any type of central processing unit (CPU), including a microprocessor, a digital signal processor (DSP), a microcontroller, an application specific integrated circuit (ASIC), a field programmable gate array (FPGA), or the like. Also, in embodiments, the memory may include random access memory (RAM), read only memory (ROM), or other electronic, optical, magnetic, or any other computer readable medium onto which is stored data and algorithms as executable instructions in a non-transitory form.

In one or more embodiments, the controller 502 is configured to operate the test signal source 504 and the DC bias voltage supply 506 to supply a test signal to the UUT 520 which will either have a voltage that is below or is above the threshold voltage of the lightning protection circuit. Based on this, the testing signal source 504 can measure an impedance value for the UUT 520 in both cases. When the voltage is above the threshold voltage, the impedance value will be a measure of just the circuits before the lightning protection circuit because the lightning protection circuit will be turned off. The circuits before the lightning protection circuit can be, for example, an HIRF filter. When the voltage of the test signal/DC bias is below the threshold voltage, the impedance value will be a measure of all the components in the UUT 520 because the lightning protection circuit will be turned on. The injection transformer 510 is similar to a current transformer (CT) in the form of a donut shaped core with a secondary winding. The DC power cable feeds through the donut to form a one-turn primary winding. The test signal voltage can be added to the 28V DC source (i.e., in series, but a load current is not ideal). The injection transformer 510 is utilized to separate the high current from the test signal source 504.

Figure 6:
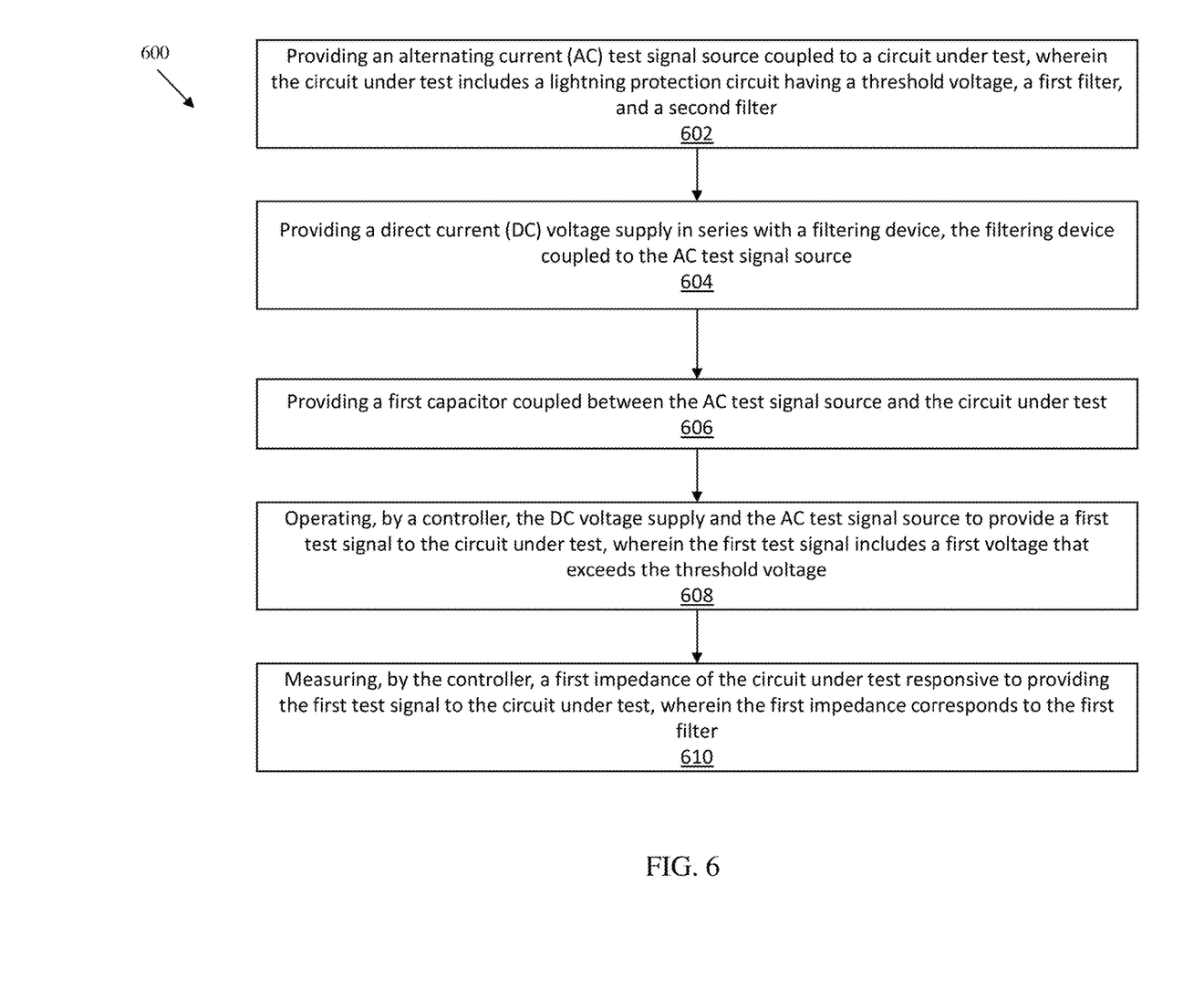
FIG. 6 depicts a flow diagram of a method for testing lightning protection circuits according to one or more embodiments.

FIG. 6 depicts a flow diagram of a method for testing lightning protection circuits according to one or more embodiments. The method 600 includes providing an alternating current (AC) test signal source coupled to a circuit under test, wherein the circuit under test including a lightning protection circuit having a threshold voltage, a first filter, and a second filter, as shown in block 602. The circuit under test includes the lightning protection circuit between the first filter and second filter which correspond to an HIRF filter and EMI filter, respectively. At block 604, the method 600 continues by providing a direct current (DC) voltage supply in series with a filtering device, the filtering device coupled to the AC test signal source. Here the filter device can be a LISN as described in FIG. 4. At block 606, the method 600 also includes providing a first capacitor coupled between the AC test signal source and the circuit under test. The capacitor blocks the effects of the DC power supply bias voltage. The method 600, at block 608 also includes operating, by a controller, the DC voltage supply and the AC test signal source to provide a first test signal to the circuit under test, wherein the first test signal comprise a first voltage that exceeds the threshold voltage. And at block 610, the method 600 includes measuring, by the controller, a first impedance of the circuit under test responsive to providing the first test signal to the circuit under test, wherein the first impedance corresponds to the first filter.

Additional processes may also be included. It should be understood that the processes depicted in FIG. 6 represent illustrations, and that other processes may be added or existing processes may be removed, modified, or rearranged without departing from the scope and spirit of the present disclosure.

The term "about" is intended to include the degree of error associated with measurement of the particular quantity based upon the equipment available at the time of filing the application. For example, "about" can include a range of ±8% or 5%, or 2% of a given value.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" may be understood to include any integer number greater than or equal to one, i.e. one, two, three, four, etc. The terms "a plurality" may be understood to include any integer number greater than or equal to two, i.e. two, three, four, five, etc. The term "connection" may include both an indirect "connection" and a direct "connection."

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. A system comprising:
   an alternating current (AC) test signal source coupled to a circuit under test, wherein the circuit under test comprising a lightning protection circuit having a threshold voltage, a first filter, and a second filter;
   a direct current (DC) voltage supply;
   a filtering device coupled between the DC voltage supply and the AC test signal source;
   a first capacitor coupled between the AC test signal source and the circuit under test; and
   a controller configured to:
      operate the DC voltage supply and the AC test signal source to provide a first test signal to the circuit under test, wherein the first test signal includes a first voltage that exceeds the threshold voltage; and
      measure a first impedance of the circuit under test responsive to providing the first test signal to the circuit under test, wherein the first impedance corresponds to an impedance of the first filter.

2. The system of claim 1, wherein the controller is further configured to:
   operate the DC voltage supply and the AC test signal source to provide a second test signal to the circuit under test, wherein the second test signal comprises a second voltage that is below the threshold voltage;
   measure a second impedance of the circuit under test responsive to providing the second test signal to the circuit under test, wherein the second impedance corresponds to the first filter, the lightning protection circuit, and the second filter; and
   determining at least one fault for the circuit under test based on the first impedance and the second impedance.

3. The system of claim 1, wherein the lightning protection circuit is in series between the first filter and the second filter.

4. The system of claim 3, wherein the first filter is closer to an external input of the circuit under test than the second filter.

5. The system of claim 1, wherein the lightning protection circuit is configured to block the first test signal based on the first voltage exceeding the threshold voltage.

6. The system of claim 1, wherein the lightning protection circuit is configured to clip the first test signal based on the first voltage exceeding the threshold voltage.

7. The system of claim 1, wherein the filtering device comprises a line impedance stabilization network (LISN).

8. The system of claim 1, wherein the first filter comprises a high-intensity radiated field (HIRF) filter.

9. The system of claim 1, wherein the second filter comprises an electromagnetic interference (EMI) filter.

10. The system of claim 1, wherein the first capacitor has a capacitance of at least 100 micro-Farads.

\* \* \* \* \*